(12) United States Patent
Wright

(10) Patent No.: US 7,787,829 B1
(45) Date of Patent: Aug. 31, 2010

(54) METHOD AND APPARATUS FOR TUNING A RADIO RECEIVER WITH A RADIO TRANSMITTER

(75) Inventor: David G. Wright, Escondido, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 757 days.

(21) Appl. No.: 11/006,998

(22) Filed: Dec. 7, 2004

Related U.S. Application Data

(60) Provisional application No. 60/532,753, filed on Dec. 23, 2003.

(51) Int. Cl.
*H04B 1/40* (2006.01)
(52) U.S. Cl. .............................. 455/77; 455/68; 455/70; 455/76; 455/78
(58) Field of Classification Search .................. 455/68, 455/70, 76, 77, 78, 180.3; 375/326, 268; 716/4; 331/116 R; 327/156
See application file for complete search history.

(56) References Cited

U.S. PATENT DOCUMENTS

| | | | | |
|---|---|---|---|---|
| 5,260,671 A | * | 11/1993 | Iso et al. | 329/302 |
| 5,745,523 A | * | 4/1998 | Dent et al. | 375/216 |
| 5,748,621 A | * | 5/1998 | Masuda et al. | 370/337 |
| 5,898,903 A | | 4/1999 | Hu et al. | |
| 6,052,036 A | * | 4/2000 | Enstrom et al. | 331/176 |
| 6,058,291 A | | 5/2000 | Ketcham | |
| 6,072,842 A | * | 6/2000 | Janesch et al. | 375/326 |
| 6,081,700 A | * | 6/2000 | Salvi et al. | 455/193.3 |
| 6,108,525 A | * | 8/2000 | Takemura | 455/67.14 |
| 6,128,468 A | * | 10/2000 | Wyrwas | 455/12.1 |
| 6,215,295 B1 | | 4/2001 | Smith, III | |
| 6,337,604 B1 | * | 1/2002 | Clarke | 331/116 R |
| 6,377,640 B2 | * | 4/2002 | Trans | 375/354 |
| 6,522,696 B1 | * | 2/2003 | Mobin et al. | 375/262 |
| 6,559,731 B2 | * | 5/2003 | Jakobsson | 331/176 |
| 6,647,276 B1 | | 11/2003 | Kuwahara et al. | |
| 6,668,025 B1 | * | 12/2003 | Sumi et al. | 375/326 |
| 6,882,831 B2 | | 4/2005 | Shi et al. | |
| 6,933,788 B2 | * | 8/2005 | Forrester | 331/1 R |
| 6,952,124 B2 | * | 10/2005 | Pham | 327/156 |
| 6,980,823 B2 | | 12/2005 | Challa et al. | |
| 7,031,676 B2 | | 4/2006 | Shi | |
| 7,066,643 B2 | | 6/2006 | Lee et al. | |
| 7,098,749 B2 | * | 8/2006 | Forrester | 331/176 |
| 7,113,744 B1 | * | 9/2006 | Moloudi et al. | 455/20 |
| 7,155,189 B2 | * | 12/2006 | Zumkeller et al. | 455/260 |

(Continued)

OTHER PUBLICATIONS

USPTO Notice of Allowance for U.S. Appl. No. 11/297,505 dated Oct. 21, 2009; 8 pages.

(Continued)

*Primary Examiner*—Yuwen Pan
*Assistant Examiner*—April G Gonzales

(57) ABSTRACT

Wireless devices transmit and receive radio signals based upon reference frequencies that are generated by reference frequency circuits. If the reference frequency in the transmitter is different from the reference frequency in the receiver, the radio signals may not be received properly or may not be capable of being received at all. A measurement circuit measures the amount of error or signal corruption in radio signals due to the reference frequency offset. A trimming circuit then tunes the reference frequency in the transmitter or receiver to reduce the reference frequency offset.

20 Claims, 7 Drawing Sheets

U.S. PATENT DOCUMENTS

| | | | |
|---|---|---|---|
| 7,254,755 B2 * | 8/2007 | de Obaldia et al. | 714/715 |
| 7,269,394 B2 | 9/2007 | Fei et al. | |
| 7,433,395 B2 | 10/2008 | Sedarat | |
| 7,460,499 B2 | 12/2008 | Eliezer et al. | |
| 7,630,463 B2 | 12/2009 | Shin et al. | |
| 2001/0022539 A1 * | 9/2001 | Jakobsson | 331/172 |
| 2001/0044288 A1 * | 11/2001 | Zumkeller et al. | 455/257 |
| 2004/0037365 A1 * | 2/2004 | King et al. | 375/268 |
| 2004/0148580 A1 * | 7/2004 | de Obaldia et al. | 716/4 |
| 2005/0085249 A1 | 4/2005 | Goldstein et al. | |
| 2005/0123036 A1 * | 6/2005 | Rahman et al. | 375/240 |
| 2007/0127562 A1 * | 6/2007 | Gehring et al. | 375/227 |

OTHER PUBLICATIONS

USPTO Advisory Action for U.S. Appl. No. 11/297,505 dated Sep. 11, 2009; 3 pages.

USPTO Final Rejection for U.S. Appl. No. 11/297,505 dated Jul. 6, 2009; 19 pages.

USPTO Non-Final Rejection for U.S. Appl. No. 11/297,505 dated Jan. 15, 2009; 11 pages.

International Search Report of the International Searching Authority for International Application No. PCT/US06/61658 mailed Nov. 20, 2007; 2 pages.

Written Opinion of the International Searching Authority for International Application No. PCT/US06/61658 mailed Nov. 20, 2007; 4 pages.

University of Saint Andrews, "Broadcasting and Communications 16.1 The Crowded Party," Copyright 1995-2006; 9 pages.

Wenzel Associates Inc., "Tuning Range," <http://www.wenzel.com/documents/tuning.html>, Copyright 1995-2006; 5 pages.

Hewlett Packard, "Digital Modulation in Communications Systems—An Introduction—Application Note 1298," 1997; 47 pages.

Cypress Semiconductor Corporation, "WirelessUSB LS Theory of Operation," Revision Aug. 2003; 4 pages.

Zolomy et al., "Antenna Tuning Technique Cuts Size, Cost in ISM Designs," Integration Associates, Jan. 2004; 7 pages.

Gabor Zoka, "Refined I/Q Imbalance Measurements," Mircowaves & RF, <http://www.mwrf.com/Articles/Print.cfm?ArticleD=8318, Jun. 2004; 8 pages.

Cypress Semiconductor Corporation, "WirelessUSB Crystal Guidelines," Revision Mar. 2005; 2 pages.

Aeroflex Corporation, "Application Note: An Introduction to Digital and Vector Modulation," Part No. 46891/863, Issue 2, Aug. 2005; 10 pages.

William H. Pratt, "A Direct Quadrature Modulator IC for 0.9 to 2.5 GHz Wireless Systems," RF Design, Aug. 1994; 5 pages.

* cited by examiner

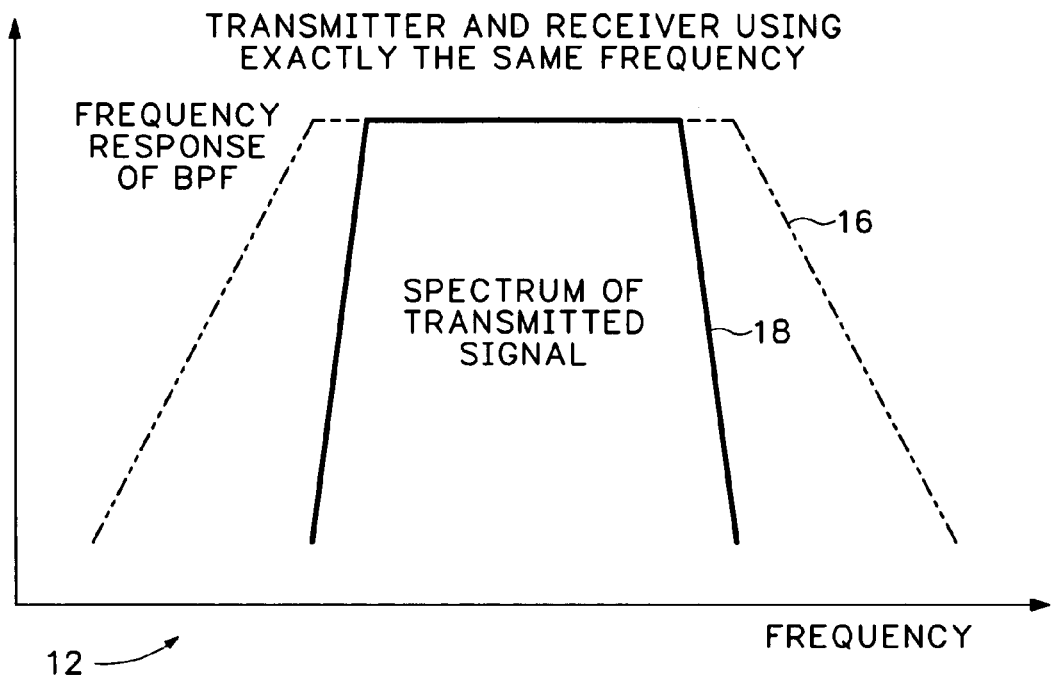
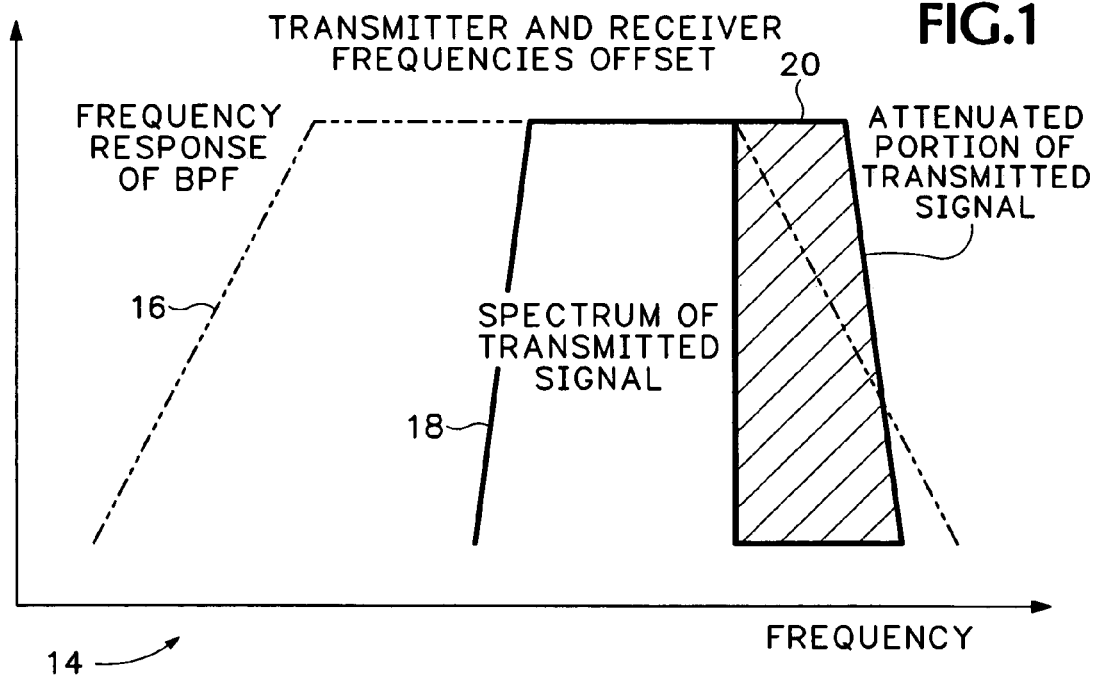
FIG.1

METHOD AND APPARATUS FOR TUNING A RADIO RECEIVER WITH A RADIO TRANSMITTER

This application claims priority from U.S. Provisional Application Ser. No. 60/532,753, filed Dec. 23, 2003.

TECHNICAL FIELD

The present invention relates generally to electronic circuits and in particular to circuits used for data communications.

BACKGROUND OF THE INVENTION

Conventional short range data radios typically divide the radio spectrum within which they operate into non-overlapping frequency channels. For example, radios with a 1 Megahertz (MHz) occupied bandwidth operating in the 2.4 Gigahertz (GHz) Industrial Scientific Medical (ISM) band typically divide that spectrum into approximately eighty 1-MHz wide channels. These radio systems transmit and receive data using frequency modulated Radio Frequency (RF) signals centered on one of these 1-MHz channels. In some cases, the transmitter may hop between channels during normal data transmission. In other cases, having found a good channel, the transmitter may continue to use that one channel unless or until data transfer on that channel becomes unreliable.

Typically, these radio systems generate the RF carrier frequency by multiplying the frequency of a low frequency crystal oscillator up to the RF frequency used for transmission. Many 2.4 GHz radio systems use 13 MHz crystals for this purpose, but crystal frequencies in the 12-32 MHz range are also common.

Radio receivers, especially Frequency Modulation (FM) receivers using a low Intermediate Frequency (IF), typically implement a Band Pass Filter (BPF), through which the mixed-down signal is passed before demodulation. This is necessary in order to prevent RF signals on adjacent channels from being demodulated, or interfering with the reception of signals on the channel the receiver is currently configured to receive.

The crystal oscillators of both the transmitter and receiver should be oscillating at almost exactly the same frequency. If not, part of the transmitted signal may be attenuated by the receiver's BPF. This is shown in FIG. 1. Frequency response 12 shows the frequency spectrum of a transmit signal 18 and the frequency operation of a receiver's Band Pass Filter (BPF) 16. When the transmitter and receiver have crystal oscillators with the same frequency, the transmit signal 18 should be substantially centered within the BPF 16. In this common reference frequency condition, the transmitted signal 18 will have minimum attenuation.

Frequency response 14 shows the frequency spectrum when the transmitter and receiver have crystal oscillators with different (offset) reference frequencies. In this offset frequency situation, the transmit signal 18 is no longer centered within the BPF 16. Any portion of the transmit signal 18 extending outside of BPF 16 is attenuated, such as the shaded portion 20. The attenuation 20 lowers the signal strength of signal 18 and can prevent the receiver from successfully or reliability receiving data carried in the transmit signal 18.

In one example, a radio system may operate at 2.4 GHz, with a 1 MHz channel spacing and a 900 kHz occupied bandwidth. At 2450 MHz, a 50 parts per million (ppm) offset is equal to 122.5 kHz. As the occupied bandwidth is 100 kHz less than the channel spacing, there is 50 kHz on either side of a perfectly centered transmitter spectrum that is not part of the adjacent channel. In the 50 ppm offset example, 7.2% of the transmitted signal extends into the adjacent channel. Typically, the receiver BPF is a little wider than the channel, and the roll-off of the filter is not a "brick wall", so a small offset can be tolerated with minimal impact on receive sensitivity. In a typical 2.4 GHz radio system, a 50 ppm offset is approximately the maximum that can be tolerated without significantly impacting performance.

Conventional wireless solutions use quartz crystals to derive a radio carrier reference frequency. These conventional solutions have disadvantages, including requiring expensive, high accuracy crystals. Even using such crystals, significant offsets may exist between the transmit and receive frequency resulting in reduced receive sensitivity. Even moderately affordable crystals may require time-of-manufacture crystal trimming, thereby increasing manufacturing cost and complexity.

The receiver and transmitter are each subject to separate oscillator frequency inaccuracies. Therefore the receiver and transmitter require a crystal with an accuracy of better than +/−25 parts per million (ppm) to prevent the oscillator accuracy from impacting system performance with a combined worst case error of greater than 50 ppm.

Crystal oscillator accuracy is typically specified as three components; initial tolerance, temperature variation, and long-term drift. In order to put products in the best possible light, crystal oscillator vendors typically quote only the initial tolerance. Frequency variation with temperature is usually similar to the initial tolerance, and aging is usually in the range of one to five ppm per year.

Crystals generally drift in the same direction. Two instances of the same crystal would not usually drift in opposite directions, but they may well drift at different rates in the same direction. One factor affecting drift is the drive strength of the oscillator circuit driving the crystal. Another factor may be the proportion of time that the crystal oscillator is active. Over 5 years, a crystal with a 3 ppm/year drift spec may drift only 5 ppm (or less) or not at all, while another may drift 15 ppm. This crystal drift depends on drive strength, the amount of time that the oscillator is running, and the physical properties of the individual crystal.

The frequency variation with temperature is not linear, but rather typically a quadratic or cubic curve. Therefore, variations in temperature across only part of the rated range may cause frequency to vary over most of the stated tolerance.

Therefore, a 25 ppm crystal, which initially may appear to be suitable for uses in the wireless applications discussed above, may not in fact be suitable. Such a crystal would typically have 25 ppm initial tolerance, 25 ppm variation over temperature, and 3 ppm/year drift. One such crystal, starting at −25 ppm, and operated at a temperature which caused the frequency to oscillate at close to its minimum frequency, may be oscillating at minus 50 ppm from its nominal after 5 years. Another crystal, starting at +25 ppm, at a different temperature may oscillate at +65 ppm from its nominal after 5 years, resulting in a difference of 115 ppm. This drift could severely impact the receive sensitivity of almost any 2.4 GHz radio system. Therefore, to meet the +/−25 ppm spec discussed above, a more expensive 10 ppm crystal is required.

Above 30 ppm, the cost savings from specifying a looser tolerance is low. For example, one vendor may offer a 13 MHz 30 ppm crystal in volume at a given price, and the 50 ppm version of the same crystal may only be a few cents cheaper. However, crystals with tolerances below 30 ppm quickly become more expensive, and a 10 ppm crystal may typically cost 3× to 5× more than the 30 ppm crystal. Frequency accuracy requirements of a design may therefore place a significant cost burden on low cost wireless systems.

For this reason, many low cost radio Integrated Circuits (ICs) include a feature allowing trimming of the initial crystal frequency. Typically this is implemented by using a digitally trimmable capacitance. At manufacturing test of a wireless product, the oscillator frequency is measured, and an appropriate trim factor is stored in non-volatile memory within the device. This trim factor is loaded into a radio Integrated Circuit (IC) after each reset and allows the digitally controlled capacitance of the crystal oscillator to tune the crystal frequency to a nominal value. This removes the initial tolerance component of the oscillator, reducing the variation to just the temperature and drift components.

This technique allows the use of 15 ppm crystals with many 2.4 GHz radio ICs, without impacting radio performance. However, this comes at the cost and trouble of implementing crystal tuning during manufacture. Regardless, 15 ppm, and even 20 ppm, crystals are still much more costly than 30 ppm crystals.

It would be desirable to use much less accurate crystals in low cost radio transmitters and receivers.

SUMMARY OF THE INVENTION

Wireless devices transmit and receive radio signals based upon reference frequencies that are generated by reference frequency circuits. If the reference frequency in the transmitter is different from the reference frequency in the receiver, the radio signals may not be received properly or may not be capable of being received at all. A measurement circuit measures the amount of error or signal corruption in radio signals due to the reference frequency offset. A trimming circuit then tunes the reference frequency in the transmitter or receiver to reduce the reference frequency offset.

BRIEF DESCRIPTION OF THE DRAWINGS

FIG. 1 shows attenuation of a transmitted signal when the transmitter and receiver reference frequencies are offset.

DETAILED DESCRIPTION

Figure 2:
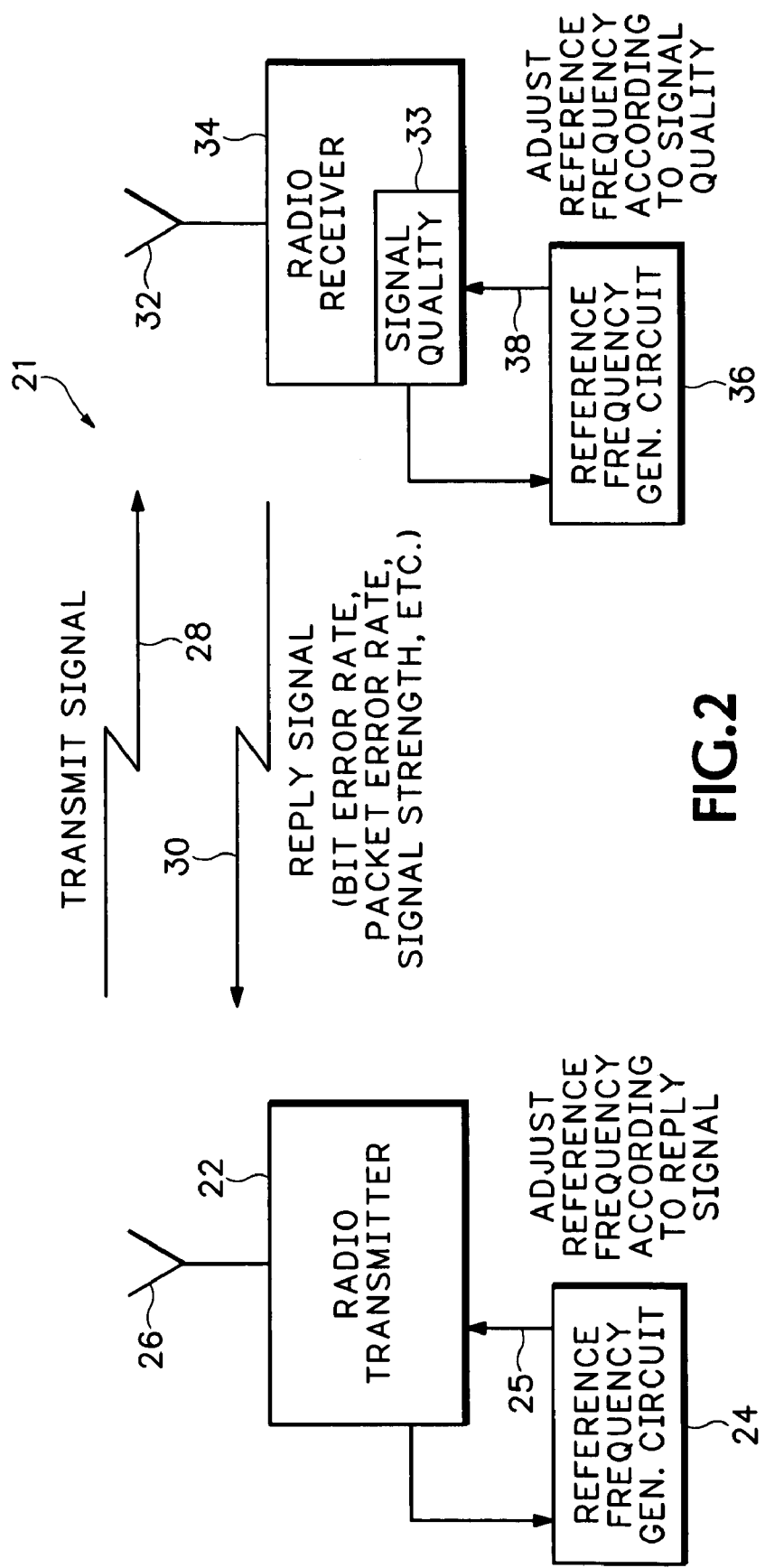
FIG. 2 shows an exemplary implementation of a system that provides reference frequency compensation.

FIG. 2 shows reference frequency tuning system 21 that tunes the reference frequency of a a radio receiver 34 with the reference frequency of a radio transmitter 22. The radio transmitter 22 includes an antenna 26 that transmits signals 28 that are received by the antenna 32 of receiver 34. In one embodiment, the radio receiver 34 calculates signal quality information 33 associated with the received signal 28 and then uses that signal quality information 33 to adjust the reference frequency 38 used by the radio receiver 34 for demodulating the transmit signal 28. For example, a trimming operation is performed in the reference frequency generation circuit 36 that tunes the output frequency 38 to the frequency 25 used by the reference frequency circuit 24 in the transmitter 22. In other words, the reference frequency 38 in the receiver 34 is varied until it is tuned (zero offset) with the reference frequency 25 in the transmitter 22.

Signal quality information 33 can be any signal measurement or statistic that indicates the transmitter 22 and the receiver 34 have offset reference frequencies. For example, the signal quality information 33 may be a Bit Error Rate (BER), packet error rate, signal strength, or any other indicator of frequency offset. Calculating these signal quality measurements have been used for other purposes in the past, and are therefore known to those skilled in the art, and are therefore not described in further detail.

In an alternative embodiment applicable in two-way systems, the receiver 34 may send the signal quality measurements 33 back to the transmitter 22 in signal 30. The transmitter 22 then trims its reference frequency 25 according to the signal quality measurements 33 in signal 30. In another embodiment, the signal 30 may just carry the ppm value for the desired frequency offset to use for reference frequency 25. The transmitter 22 varies the reference frequency 25 until the signal quality information 33 identified in reply signal 30 is within an acceptable level.

The tuning system 21 may use a single frequency in normal operation (one of many channels available) or may use a frequency hopping system such as used in Frequency Hopping Spread Spectrum (FHSS) systems. The tuning system 21 can also use a single point to point (1-1) radio link or can be implemented in a network of wireless devices, with an overall network coordinator or master.

It is not essential that the transmitter 22 and receiver 34 operate exactly on a pre-determined nominal frequency. For example, the transmitter 22 and receiver 34 may be designed to operate at a nominal frequency of 2450 MHz. The radios can work equally as well if both are centered at 2450.1 MHz. There may be a slight reduction in immunity to adjacent channel signs, but in general, the sloped (as opposed to brick-wall) roll-off of the receiver BPF means that wireless systems typically try to avoid using adjacent channels between 2 pairs of closely located devices.

If the transmitter and receiver frequencies are significantly offset, even by one or two hundred ppm, the receiver 34 will not completely fail to receive the transmitted signal. Instead the Bit Error rate (BER) on the wireless link 28 will be very high. This will often make it difficult for the receiver 34 to successfully receive significant quantities of transmitted data, but the receiver 34 will still be aware that the signal 28 is being transmitted. Sufficient data will get though so that the receiver 34 will be able to recognize the transmitter 22 as its counter-part, rather than an interfering signal.

In the case of two-way wireless systems, where each wireless device includes both a radio transmitter and receiver, only one of the wireless devices might incorporate the reference frequency trimming operation. In a many to 1 wireless radio system, such as a system in which multiple "slaves" send data to a single "master" receiver, the frequency trimming operation might be incorporated in each of the slaves, which would then seek to tune their radios to the master device.

Figure 3:
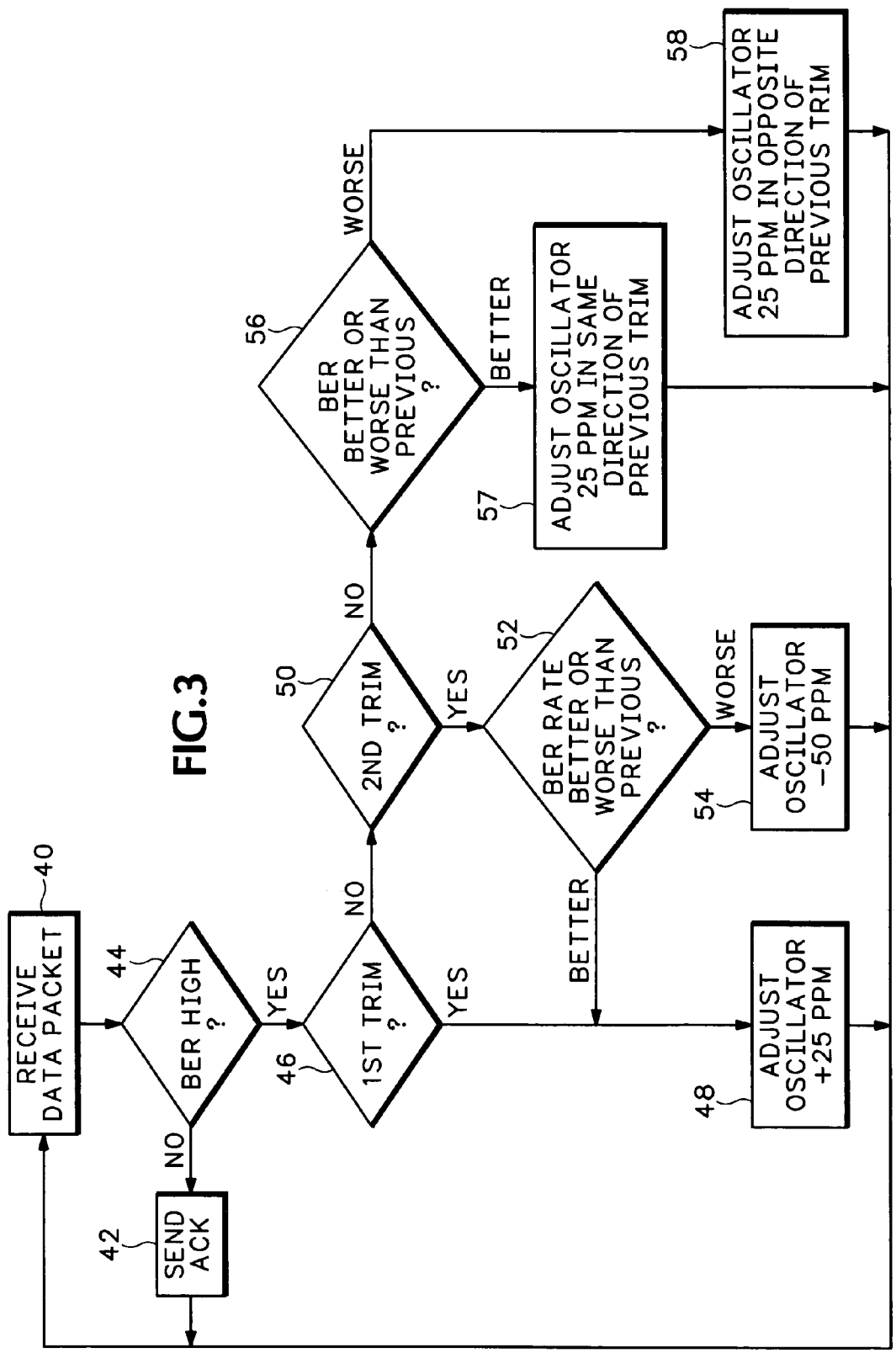
FIGS. 3 and 4 show one example of how the reference frequency is compensated in FIG. 2.
Figure 4:
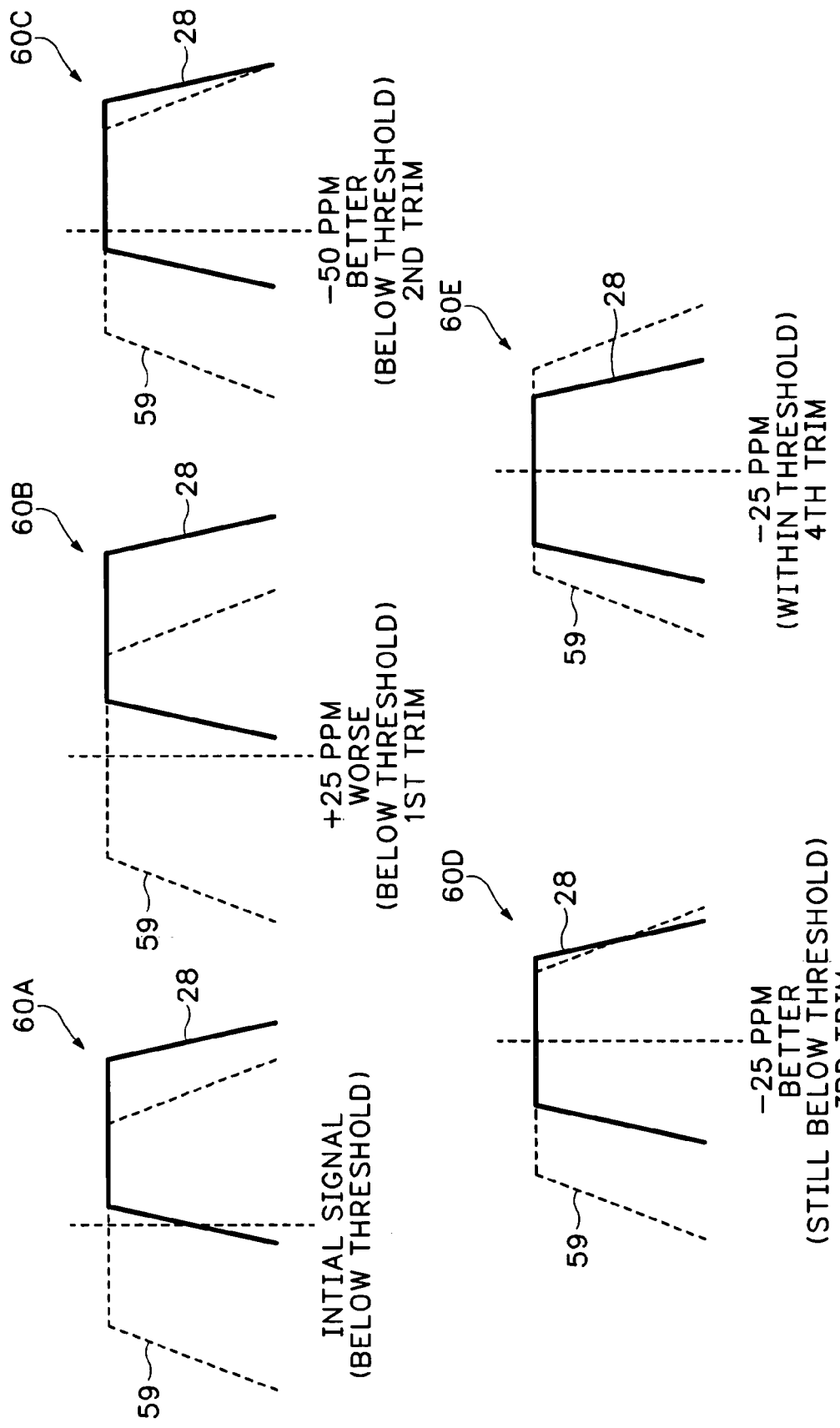

FIGS. 3 and 4 show one example of how the reference frequency is turned in the reference frequency circuits 24 or 36 in FIG. 2. The tuning operations described in FIGS. 3 and 4 can be performed in the receiver 34 (FIG. 2) or can be performed in the transmitter 22 (FIG. 2). For illustrative purposes, the description in FIGS. 3 and 4 will refer to the frequency trimming operation as being performed in the receiver 34.

The transmitter 22 (FIG. 2) sends data to the receiver 34 and the receiver 34 demodulate the received data in block 40 of FIG. 3. The data may be successfully received. For example, there may be sufficiently few bit errors after error correction techniques have corrected the data. The receiver in block 40 accordingly sends back an acknowledge handshake packet to the transmitter and the transaction completes.

However, the bit error rate in the data may be uncorrectable. In this case, the receiver 34 will not respond. After a timeout period, the transmitter 22 will then retransmit the data packet. Having received a corrupted data packet, the receiver in block 44 stores a measure of the bit error rate of the corrupted packet. The receiver then changes its oscillator trim capacitance attempting to correct for an inferred oscillator frequency offset between the transmitter and receiver. An example of the frequency offset between the transmitter 22 and receiver 34 is represented by initial frequency response 60A in FIG. 4. The initial frequency response 60A shows the transmit signal 28 offset from the expected frequency response of the Band Pass Filter (BPF) 59 of the receiver 34. This is similar to the frequency response 14 shown in FIG. 1.

The initial offset frequency response 60A results in the transmit signal 28 generating a high BER in block 44 of FIG. 3. If a first trim operation is being performed in block 46, the receiver shifts its oscillator frequency by 25 ppm in a random direction in block 48. This of course is just one example and other shift values can also be used. In this example, the receiver reference frequency is shifted +25 ppm and is shown graphically as first trim stage 60B in FIG. 4. The receiver 34 then waits for the transmitter 22 to transmit another packet.

The initial +25 ppm trim in the first trim stage may have provided the desired result by reducing the BER below some threshold value in block 44 of FIG. 3. Accordingly, the receiver 34 sends an acknowledge to the transmitter 22 in block 42 confirming to the transmitter 22 that the receiver 34 is now operating at the same, or substantially the same, oscillator frequency. The receiver 34 stores the trim value and continues to use that oscillator trim setting until a future uncorrectable packet is received.

However, the BER in block 44 may still be above some BER threshold after the first trim stage 60B. During a second trim stage in block 50, the receiver 34 first compares the BER of first trim stage 60B with the initial signal response 60A (FIG. 4). If the first trim stage 60B improved the BER in block 52, the receiver 34 infers that the oscillator frequency was trimmed in the correct direction, but not far enough. In this case, the receiver 34 trims its crystal another 25 ppm in the same direction in block 48.

However, the first trim stage 60B may make the BER worse than initial signal response 60A. This is the case in FIG. 4 where the first trim stage 60B moves the transmit signal 28 further outside of BPF 59. In this case, the receiver 34 infers that the oscillator frequency was trimmed in the wrong direction and trims the oscillator frequency 50 ppm in the opposite direction in block 54. This is 25 ppm on the other side of the original frequency and is shown as second trim stage 60C in FIG. 4.

The process is repeated. In the example shown in FIG. 4, the BER rate is still above the BER threshold value in block 44 after the second trim stage 60C. However, in block 56, the BER after the second trim stage 60C is better then the BER of the previous trim stage 60B. Accordingly, in block 57 the receiver 34 trims the oscillator frequency another 25 ppm in the same direction as the previous trim stage. This is shown as third trim stage 60D in FIG. 4 that shifts the reference frequency in the receiver another −25 ppm.

While showing improvement, the BER rate for the third trim stage 60D is still above the BER rate threshold in block 44. The receiver in block 57 again trims the crystal oscillator frequency another −25 ppm in block 57. This is shown as the fourth trim stage 60E in FIG. 4. After the fourth trim stage 60E, the BER rate is now within an acceptable range in block 44. The receiver 34 accordingly sends the acknowledge signal to the transmitter 22 in block 42.

As shown above, the process above iteratively repeats until a packet is either correctly received, or the transmitter times out. A timeout may occur due to the presence of an on-band interfering signal, or because the transmitter and receiver are further apart in distance than the operating range of the wireless link can support.

In many cases, a significant bit error rate may exist in normal communications, especially towards the limits of distance range. Uncorrectable packets may therefore be received for a reason other than reference frequency offset. In this case, the receiver would not try shifting its oscillator trim value until a number of successive uncorrectable packets had been received.

Transmit and Receive Circuitry

Figure 5:
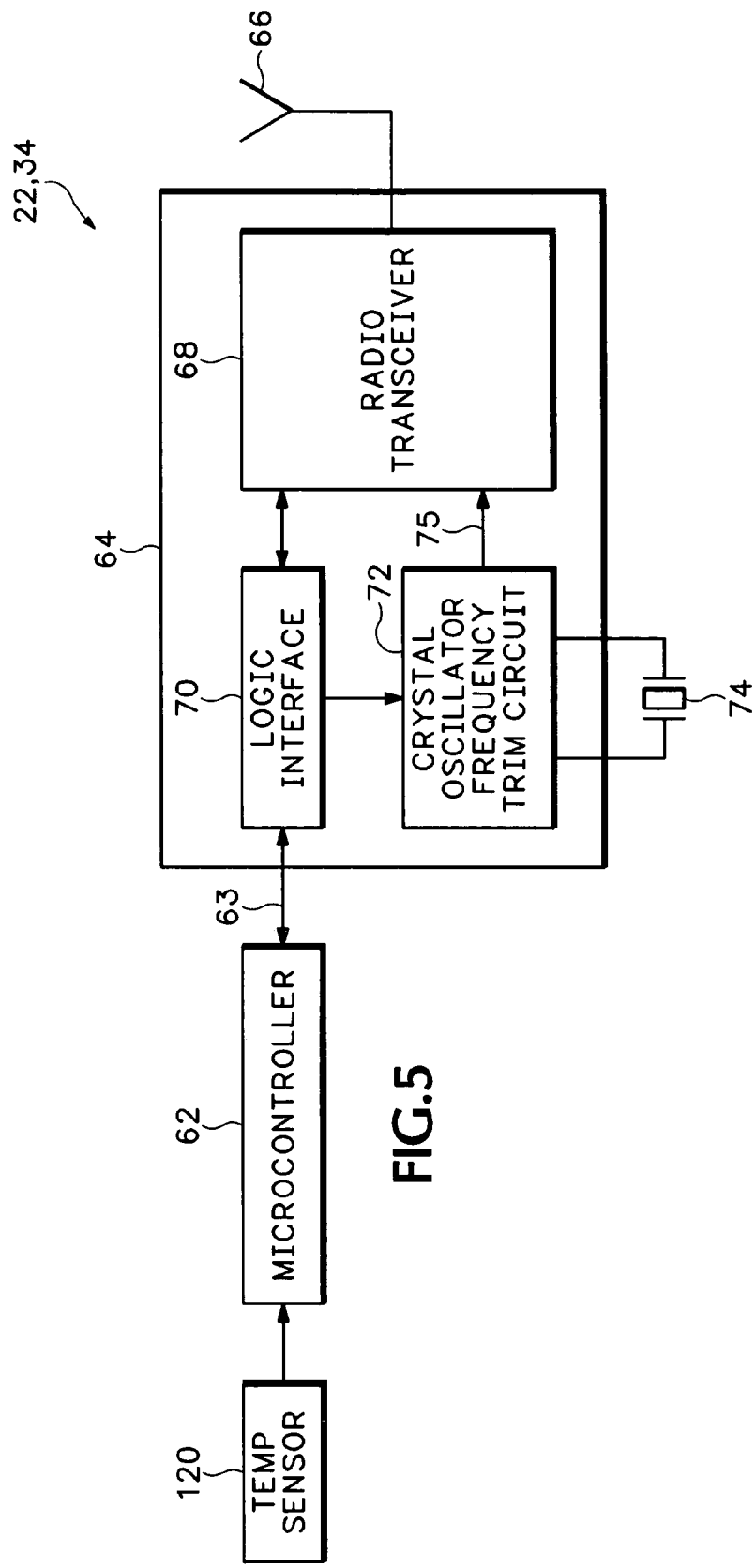
FIG. 5 shows a radio device that provides reference frequency compensation.

FIG. 5 shows in more detail an example of circuitry that may exist in the transmitter 22 or receiver 34 for trimming a reference frequency. An antenna 66 receives or transmits wireless signals. A radio transceiver 68 is coupled to the antenna 66 and communicates to a microcontroller 62 through a logic interface 70. The untrimmed reference frequency 75 for the radio transceiver 68 is generated by a crystal oscillator 74. A crystal oscillator frequency trim circuit 72 varies or "trims" the untrimmed base frequency of the crystal oscillator 74 and outputs the trimmed frequency 75 to the radio transceiver 68. Adjustment of the base frequency of the crystal oscillator 74 can be controlled by logic in the radio transceiver 68 or by the microcontroller 62.

Over time, temperature, etc. the original specified frequency crystal oscillator 74 may change. As described above, the frequency 75 is varied by trim circuit 72 as described above in FIGS. 3 and 4 to compensate for the frequency offset between the transmitter and receiver.

Figure 6:
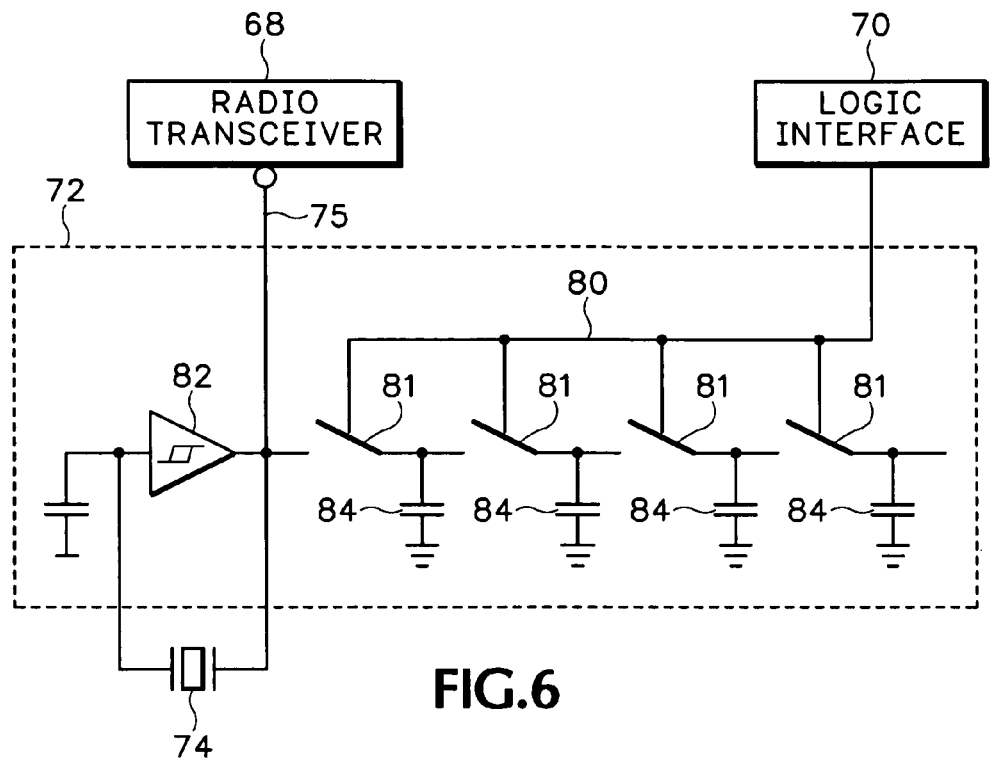
FIG. 6 is a detailed diagram of a crystal oscillator frequency trim circuit that can be used in the radio shown in FIG. 5.

FIG. 6 shows one example of the crystal oscillator frequency trim circuit 72 in FIG. 5. Of course, any circuit that varies a crystal oscillator frequency can be used, and the circuit in FIG. 6 is only one example. An amplifier 82 with hysteresis is coupled across opposite ends of the crystal oscillator 74. A set of capacitors 84 are selectively coupled to the amplifier 82 by switches that are activated by signals 80. In one example, the signals 80 are generated by the microcontroller 62 (FIG. 5) through the logic interface 70. The capacitors 84 are selectively connected or disconnected from the amplifier 82 to vary the base frequency of the crystal oscillator 74. The varied frequency 75 is output to the radio transceiver 68.

Figure 7:
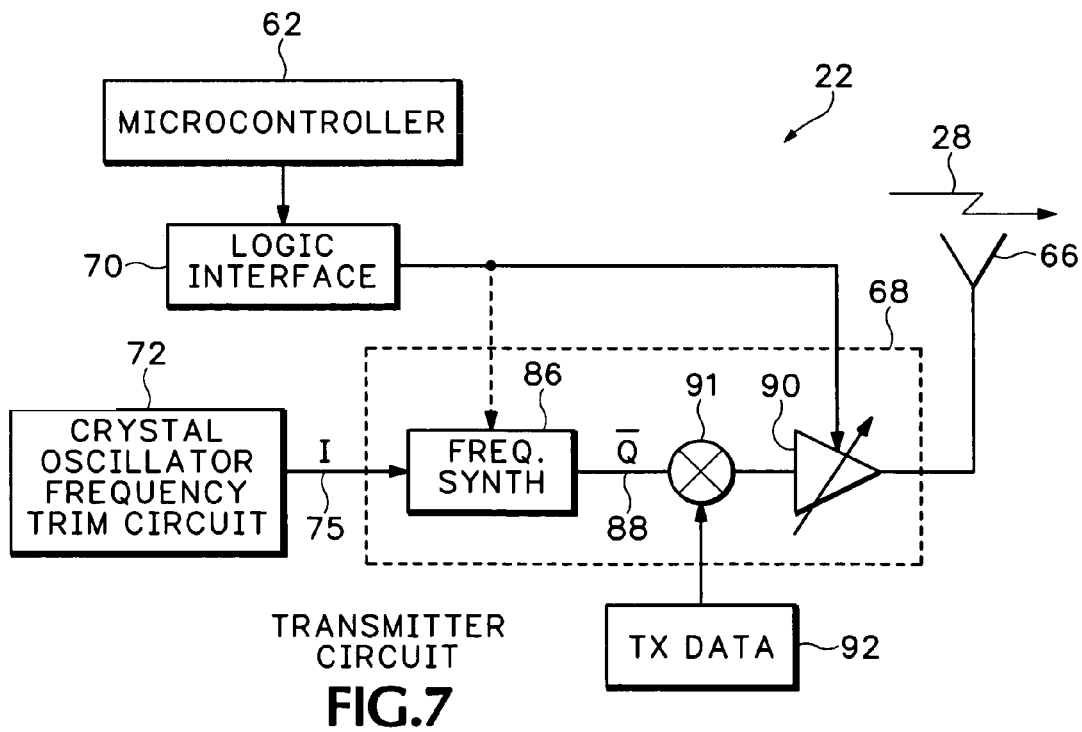
FIG. 7 is one example of radio transmit circuitry that provides reference frequency compensation.

FIG. 7 shows one example of the functions that may be contained in the radio transceiver 68 in FIG. 5 or inside the transmitter 22 shown in FIG. 2. Again, this is only an example and any type of transmitter circuitry can be used. In this example, a frequency synthesizer 86 receives the trimmed crystal oscillator frequency 75 from the trim circuit 72.

Figure 9:
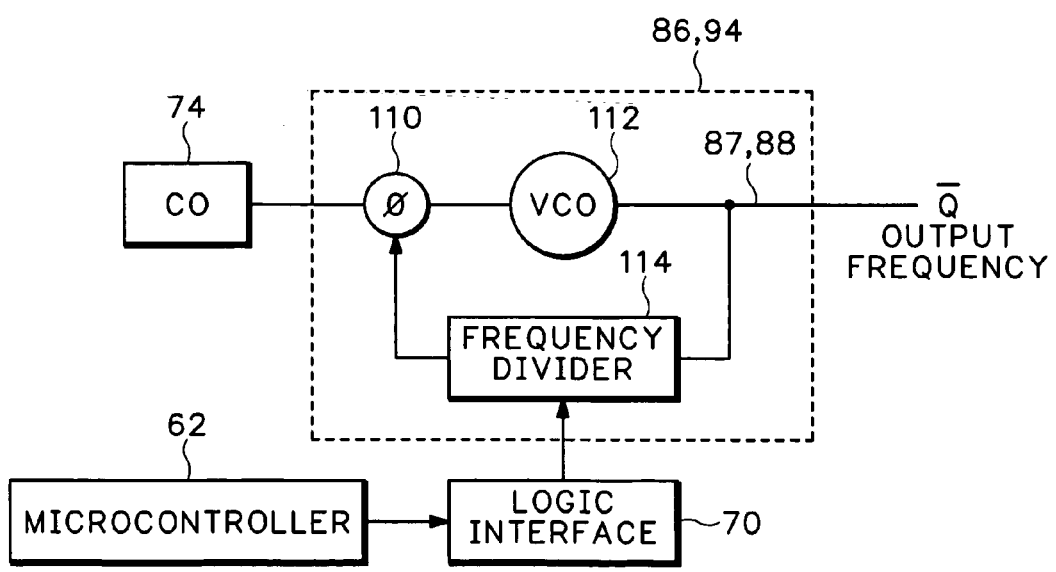
FIG. 9 is a block diagram showing how reference frequency compensation can alternatively be performed within a frequency synthesizer.

The frequency synthesizer 86 includes a phase detector (FIG. 9) that receives the output 75 of the crystal oscillator trim circuit 72 and outputs a signal to a Voltage Controlled Oscillator (VCO) (FIG. 9). The output frequency 87 is equal to the crystal oscillator frequency 75 multiplied by a devisor in a feedback loop. Typically, the divider is used to set the operating channel for the transmitter.

The frequency synthesizer 86 generates output carrier frequency 88 that is mixed with the transmit data 92 by a mixer 91. The output from the mixer 91 is amplified by an amplifier 90 and output over antenna 66. The microprocessor 62 is connected to the amplifier 90 through logic interface 70.

Figure 8:
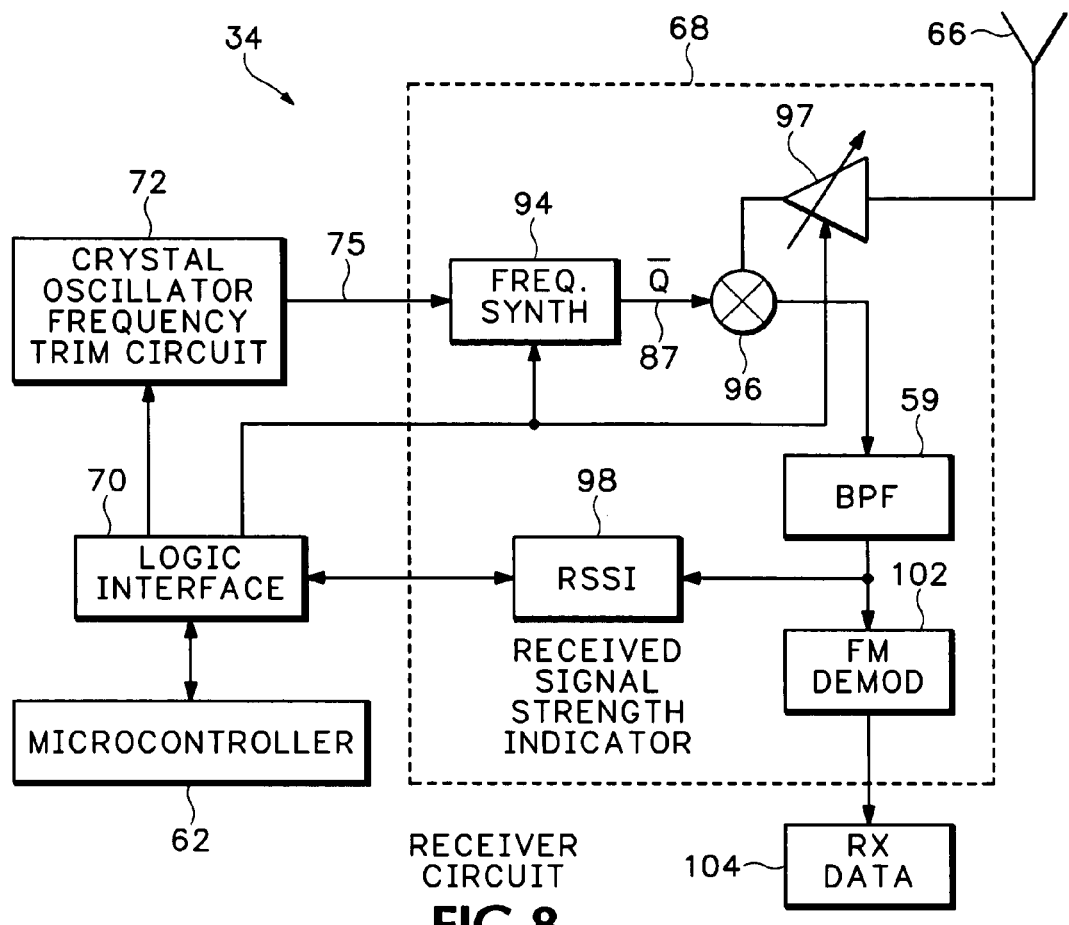
FIG. 8 is one example of radio receive circuitry that provides reference frequency compensation.

FIG. 8 shows a diagram of the receive circuitry that may exist inside the radio transceiver 68 or inside the receiver 34 shown in FIG. 2. The trim circuit 72 again feeds the trimmed crystal oscillator frequency 75 to a frequency synthesizer 94 similar to frequency synthesizer 86 in FIG. 7. The output frequency generated from the synthesizer 94 is mixed with the signal received over antenna 66 by mixer 96. The output of the mixer 96 is filtered by a Band Pass Filter (BPF) 59 as shown in the example of FIG. 4. The output of the BPF 59 is FM demodulated by demodulator 102 and output as receive data 104.

Alternative Embodiments

FIG. 9 shows one alternative embodiment where the crystal oscillator frequency is trimmed by varying the output frequency of the frequency synthesizer 86 or 94 in FIG. 7 or 8, respectively. A programmable frequency divider 114 is coupled between a phase detector 110 and the output of a VCO 112 that varies the output frequency 87 of the frequency synthesizer 86 or 94. Instead of trimming the output of the crystal oscillator 74, the microcontroller 62 varies the output frequency of the synthesizer 86 or 94. The output frequency 87 is varied to again compensate for frequency offset between the transmitter and receiver.

The frequency of output 87 is varied by the microcontroller 62 by digitally varying the value in the frequency divider 114. The digital value of the frequency divider 114 can vary the frequency of the output signal 87 or 88 in both a positive ppm and negative ppm direction. The same iterative process shown in FIGS. 3 and 4 is performed where the value of the frequency of output signal 87 or 88 is repeatedly varied by the microcontroller 62 until the BER or signal strength of the received data signal is within some acceptable value.

Referring back to FIG. 8, in some cases, it may not be possible to readily determine the BER of the received packet, but merely that it contains errors. This may occur for example because a checksum or Cyclic Redundancy Check (CRC) byte does not match the data. In this case, an alternative way of judging relative effectiveness of varying frequency trim values is to use a Received Signal Strength Indicator (RSSI) circuit 98. The RSSI circuit 98 may already be found in many radio receiver ICs.

The RSSI 98 is typically used to detect relative differences of as little as 1 dB in signal strength reliably. The RSSI 98 is typically measured after the receiver band pass filter (BPF) 59. Thus, for a given distance between transmitter and receiver, and a given physical environment, the relative signal strength indicated by the RSSI 98 is a good indication of the relative closeness of the receiver oscillator trim frequency 75 to the oscillator frequency in the transmitter. The crystal oscillator trim values are varied until the RSSI is at the maximum value achievable within the oscillator trimming range.

Training Sessions

In some systems, it may not be acceptable for data transmissions to be delayed for the length of time needed to retransmit packets several times. However, in such systems it may be acceptable for the transmitter 22 to establish a link, and train the receiver 34 before data is ready for transmission. In this case, the transmitter 22 begins by sending a transmission to the receiver to establish a "session". The transmitter 22 sends special test transmissions, until it receives a response from the receiver 34 indicating the tuning process has completed.

The receiver 34 may use a successive approximation method to bring its oscillator frequency close to the oscillator frequency in the transmitter 22. It is the nature of wireless communications that the BER and RSSI may vary somewhat from transmission to transmission, even with all settings the same. In such a case, the receiver 34 can take average BER or RSSI readings over several transmissions before changing trim settings in circuit 72 or in synthesizer 94. After this training session is complete, the transmitter 22 is ready to transmit data, without the risk that data packets may be delayed by multiple retransmissions. In this way, it is possible for the transmitter 22 and receiver 34 to achieve improved range/performance compared with a traditional system using even the most accurate (and costly) crystals.

In one-way radio systems, there is no ability to use a handshake to cause retransmission of data. In such systems, the "training session" approach may be more suitable. In this case, the transmitter 22 makes a number of packet training transmissions, to which the receiver 34 tunes, before the transmitter 22 begins transmitting "real" data. In broadcast (one-to-many) systems, whether one-way or two-way, the "training session" approach generally may be more suitable, because of the difficulty of managing handshakes from many receivers.

In another implementation, the transmitter 22 or the receiver 34 may intentionally reduce the gain of the transmitted or received signal in order to more quickly and precisely trim the crystal oscillator frequency. For example, during frequency trimming, the distance between the transmitter 22 and receive 34 may be close enough and the signal strength strong enough so that the BER is within some acceptable range, and the BER is so low that it is difficult for the receiver 34 to accurately trim the crystal oscillator frequency. In other words, the transmitter and receiver are so close, the effects of reference frequency offset cannot be accurately detected. However, when the transmitter and receiver are moved further apart, the crystal oscillator frequency offset may cause problems with the signal transmission.

To overcome this problem, the transmitter 22 in FIG. 7 may include a variable amplifier 90 that can be turned down during the crystal oscillator frequency training session. The gain of the transmit signal 28 is intentionally reduced so that the receiver 34 can more effectively determine how much, if any, frequency offset exists between the transmitter 22 and receiver 34. Similarly, the receiver 34 in FIG. 8 can include a variable amplifier 97 that is intentionally turned down during the training session. After frequency trimming is complete in either the transmitter 22 and/or receive 34, the amplifiers 90 (FIG. 7) and/or amplifier 97 (FIG. 8) is returned to their normal operating levels.

In Frequency Hopping Spread Spectrum (FHSS) systems, the transmitter 22 and receiver 34 may not stay long enough on a single frequency to complete either a training session or multiple retransmissions on a single frequency. However, in FHSS systems where the carrier frequency of each channel is derived from the same base crystal frequency, either the training session method, or the multiple retry method may be applied. The only difference is that successive retries or successive transmissions within the training session will be on different channels.

In another embodiment, the transmitter 22 and receiver 34 may include temperature sensors 120 (FIG. 5). For example the transmitter 22 or receiver 34 in FIG. 5 may include firmware that is executed on the microcontroller (MCU) 62 that monitors the temperature sensor 120. In this embodiment, either the transmitter 22 or the receiver 34 may initiate a new training session any time a temperature change of more than a pre-determined amount is detected by temperature sensor 120. In yet another embodiment, either the transmitter 22 or the receiver 34 may initiate a training session periodically, for example once per day.

Reference frequency tuning has many advantages, including enabling the use of low cost, low precision crystals in wireless systems. A further advantage is that transmitters and receivers can tune their oscillators to each other, enabling better receive sensitivity with low cost crystals than what is generally possible even with the most accurate and expensive crystals.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The system described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention may be modified in arrangement and detail without departing from such principles. I claim all modifications and variation coming within the spirit and scope of the following claims.

The invention claimed is:

1. A wireless device, comprising:
   a crystal oscillator generating a reference frequency;
   a radio circuit configured to operate according to the reference frequency and receive a wireless data signal from another wireless device;
   a signal quality calculator configured to produce signal quality measurements according to a signal quality of the data signal, the signal quality correlated with an accuracy of the reference frequency but not indicative of a direction in which the reference frequency is offset from an operating frequency used to transmit the data signal;
   wherein the signal quality measurements are independent of direct frequency measurements; and
   a crystal oscillator trim circuit configured to trim the reference frequency of the crystal oscillator in response to the signal quality measurements, wherein the trim circuit is further configured to store a previous trimming direction for the reference frequency, and to selectively reverse the previous trimming direction when the signal quality measurements indicate that the previous trimming direction has worsened the signal quality.

2. The wireless device according to claim 1 wherein the signal quality comprises a Bit Error Rate (BER) for digital data packets carried via the data signal.

3. The wireless device according to claim 1 wherein the signal quality comprises a received signal strength of the data signal.

4. The wireless device according to claim 1 wherein the trim circuit includes load capacitance that is selectively added to or removed from the crystal oscillator to trim the reference frequency.

5. The wireless device according to claim 1, wherein the signal quality calculator is configured to repeatedly calculate a bit error rate of the data signal; and wherein the trim circuit is configured to repeatedly monitor the bit error rate and repeatedly adjust the reference frequency until the bit error rate reaches a predetermined level.

6. The wireless device according to claim 5 wherein the trim circuit is configured to adjust the reference frequency in the previous trimming direction and then monitor the bit error rate, the trim circuit configured to then adjust the reference frequency of the radio circuit further in the previous trimming direction when the monitored bit error rate improves and to adjust the reference frequency in a direction opposite of the previous trimming direction when the monitored bit error rate worsens.

7. The wireless device according to claim 1 including a variable gain amplifier configured to reduce gain of the data signal while tuning the reference frequency.

8. The wireless device according to claim 1 wherein the previous trimming direction of the reference frequency is a random direction.

9. The wireless device according to claim 1 wherein the trim circuit is configured to tune the reference frequency of the crystal oscillator by varying an output frequency of a frequency synthesizer in the radio circuit in response to the signal quality measurements.

10. A method of tuning a radio, comprising:
    determining an amount of corruption due to crystal oscillator reference frequency offset between transmitting and receiving devices by measuring a respective Bit Error Rate (BER) of each of a plurality of data transmissions between the transmitting and the receiving devices;

adjusting the reference frequency in a first direction and storing the first direction as a saved direction when there is no previously saved BER measurement; and adjusting the reference frequency in a direction opposite that of the saved direction when there is the previously saved BER measurement and when the respective BER of a current one of the data transmissions is worse than the previously saved BER measurement.

11. The method according to claim 10 further comprising adjusting the reference frequency further in the saved direction when:

there is the previously saved BER measurement;

the respective BER of the current one of the data transmissions is better than the previously saved BER measurement; and the respective BER of the current one of the data transmissions is more than a predetermined threshold.

12. The method according to claim 11 wherein the first direction is a random direction.

13. The method according to claim 10 further comprising using a received signal strength of a Radio Frequency (RF) transmission to estimate an amount of the reference frequency offset.

14. The method according to claim 10 further comprising initiating the reference frequency adjusting in response to reception of ones of the data transmissions with a high respective Bit Error Rate (BER).

15. The method according to claim 10 further comprising initiating the reference frequency adjusting in response to a change in temperature measured at either the transmitting or receiving devices.

16. The method according to claim 10 further comprising periodically initiating the reference frequency adjusting after a fixed period of time.

17. The method of claim 10 further comprising saving the respective BER of the current one of the data transmissions as the previously saved BER measurement.

18. A radio system, comprising:

a radio receiver configured to receive and process a radio transmission according to a crystal oscillator frequency;

a trimming circuit configured to selectively vary the crystal oscillator frequency; and a processing element configured to;

calculate a signal integrity for the received radio transmission;

infer a frequency offset between the crystal oscillator frequency and a selected frequency corresponding to the calculated signal integrity, wherein the inference is independent of a direct frequency measurement; and adjust the trimming circuit in response to the inferred frequency offset corresponding to the calculated signal integrity, wherein a first adjustment is in a direction independent of a difference between the crystal oscillator frequency and a desired frequency, and wherein a subsequent adjustment is in a direction according to a difference between the signal integrity prior to the first adjustment and the signal integrity after the first adjustment.

19. The radio system according to claim 18 wherein the processing element is configured to determine the signal integrity according to a Bit Error Rate (BER) for the radio transmission and repeatedly trim the crystal oscillator frequency in response to the BER until either the trimmed oscillator frequency is substantially the same as a previous trimmed oscillator frequency or until the BER value is within a desired range.

20. The radio system according to claim 18 wherein the processing element determines the signal integrity according to a received signal strength of the received radio transmission.

* * * * *